(12) United States Patent
Spick et al.

(10) Patent No.: US 11,333,784 B2
(45) Date of Patent: May 17, 2022

(54) PRESENCE DETECTION METHOD AND DEVICE WITH MULTIPLE DETECTION AREAS FOR A MOTOR VEHICLE

(71) Applicants: Continental Automotive France, Toulouse (FR); Continental Automotive GmbH, Hannover (DE)

(72) Inventors: Gabriel Spick, Toulouse (FR); Yannis Escalante, Toulouse (FR); Olivier Gerardiere, Tournefeuille (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 16/956,134

(22) PCT Filed: Jan. 18, 2019

(86) PCT No.: PCT/FR2019/050113
§ 371 (c)(1),
(2) Date: Jun. 19, 2020

(87) PCT Pub. No.: WO2019/145626
PCT Pub. Date: Aug. 1, 2019

(65) Prior Publication Data
US 2020/0355840 A1    Nov. 12, 2020

(30) Foreign Application Priority Data

Jan. 29, 2018   (FR) ..................................... 1850677

(51) Int. Cl.
*G01R 27/26* (2006.01)
*G01V 3/08* (2006.01)
(Continued)

(52) U.S. Cl.
CPC .............. *G01V 3/08* (2013.01); *B60J 5/0493* (2013.01); *E05B 81/77* (2013.01); *H03K 17/955* (2013.01);
(Continued)

(58) Field of Classification Search
CPC .... G01R 27/2605; G01R 27/02; G01R 27/22; G01R 27/26; G01R 31/2837; G01R 35/00;
(Continued)

(56) References Cited

U.S. PATENT DOCUMENTS

2010/0253141 A1* 10/2010 Cara .................. G07C 9/00309
                                                                307/9.1
2012/0098588 A1*  4/2012 Ujvari ................ G01R 27/2605
                                                                327/517
(Continued)

FOREIGN PATENT DOCUMENTS

DE   102015217179 A1   5/2016
WO    2013079842 A1   6/2013
WO    2016061429 A1   4/2016

OTHER PUBLICATIONS

International Search Report and Written Opinion for International Application No. PCT/FR2019/050113, dated Apr. 10, 2019, with partial translation, 9 pages.
(Continued)

*Primary Examiner* — Raul J Rios Russo
(74) *Attorney, Agent, or Firm* — RatnerPrestia

(57) ABSTRACT

A presence detection device including a sensor connected to a microcontroller, the sensor including a first detection capacitor arranged in a first detection area, and a second detection capacitor arranged in a second detection area. The microcontroller is configured to recurrently repeat a phase of measuring a measurement signal by charging/discharging
(Continued)

the first detection capacitor from/into the second detection capacitor, and to detect a presence of a user in the first detection area and/or the second detection area according to the measurement signal. Also disclosed are a motor vehicle including a detection device and a detection method.

12 Claims, 2 Drawing Sheets

(51) Int. Cl.
    *B60J 5/04* (2006.01)
    *E05B 81/76* (2014.01)
    *H03K 17/955* (2006.01)

(52) U.S. Cl.
    CPC ............ *H03K 2217/960705* (2013.01); *H03K 2217/960725* (2013.01); *H03K 2217/960745* (2013.01)

(58) Field of Classification Search
    CPC .... G01N 27/221; G01N 33/2852; G01V 3/08; B60J 5/0493; H03K 2217/960705; H03K 2217/960725; H03K 2217/960745; H03K 17/955; E05B 81/77
    USPC .......... 324/76.11–76.83, 459, 600, 649, 658, 324/663, 672
    See application file for complete search history.

(56) References Cited

U.S. PATENT DOCUMENTS

| | | | | |
|---|---|---|---|---|
| 2012/0139870 A1* | 6/2012 | Beyly | ................... | G06F 3/0446 345/174 |
| 2013/0321006 A1* | 12/2013 | Weingaertner | ...... | B60R 25/2054 324/679 |
| 2014/0192021 A1* | 7/2014 | Beyly | ................. | G06F 3/04166 345/174 |
| 2016/0117875 A1* | 4/2016 | Duchemin | ........... | H03K 17/955 340/5.72 |

OTHER PUBLICATIONS

International Search Report and Written Opinion for International Application No. PXT/FR2019/050113, dated Apr. 10, 2019, 13 pages (French).

* cited by examiner ated in the following table:

PRESENCE DETECTION METHOD AND DEVICE WITH MULTIPLE DETECTION AREAS FOR A MOTOR VEHICLE

CROSS REFERENCE TO RELATED APPLICATIONS

This application is the U.S. National Phase Application of PCT International Application No. PCT/FR2019/050113, filed Jan. 18, 2019, which claims priority to French Patent Application No. 1850677, filed Jan. 29, 2018, the contents of such applications being incorporated by reference herein.

FIELD OF THE INVENTION

The present invention belongs to the field of motor vehicles and relates more particularly to a method and a device for detecting the presence of a user of a motor vehicle. The invention applies in particular to the detection of the presence of a hand of a user on a door handle of a motor vehicle.

BACKGROUND OF THE INVENTION

In a motor vehicle, it is known practice to use a device for detecting the presence of a hand of a user on a handle of a door of said motor vehicle in order, for example, to allow said door to be locked and/or unlocked.

As is known, such a detection device includes a sensor, mounted at least partly in the handle of the door of the motor vehicle, and a microcontroller connected to said sensor.

In what is called a "capacitive" measurement solution, the sensor includes an electrode arranged in a detection area of said handle. As is known, the electrode forms a detection capacitor of predetermined value (expressed in farads). As a hand approaches this electrode, the apparent value of the detection capacitor increases and this increase may be used to detect the presence of a user's hand in proximity to the electrode (for example within a few centimeters of said electrode).

Existing detection devices also include a reference capacitor, which generally has substantially the same value as the detection capacitor in the absence of the presence of a hand.

To detect the presence of a hand, the detection capacitor is for example charged and discharged periodically into the reference capacitor. When discharging the detection capacitor into the reference capacitor, the charges balance between the detection capacitor and the reference capacitor, and it is possible to detect the presence of a hand according to a voltage signal representative of the discharging of said detection capacitor. Such a detection device is known as a capacitive voltage divider (or CVD).

FIG. 1 schematically shows one exemplary embodiment of a detection device 10 according to the prior art, known as a differential capacitive voltage divider (or DCVD).

As illustrated in FIG. 1, the detection device 10 includes a sensor 30 connected to a microcontroller 20. The sensor 30 includes a reference capacitor 31, the terminals of which are connected to two input/output ports 21 and 22, respectively, of the microcontroller 20. The sensor 30 also includes an electrode 32, arranged in a detection area of the door handle and connected to the input/output port 21. As is known, the electrode 32 forms a detection capacitor 33 with the electrical ground.

To detect the presence of a hand in the detection area, the microcontroller 20 calculates a measurement signal on the basis of a first voltage signal and of a second voltage signal.

The first voltage signal is measured during a phase of charging/discharging the detection capacitor 33, during which the microcontroller 20 charges the detection capacitor 33, then discharges the detection capacitor 33 into the reference capacitor 31. Once charge balancing has been achieved between the detection capacitor 33 and the reference capacitor 31, the first voltage signal is for example measured as being the voltage across the terminals of the detection capacitor 33.

Such a phase of charging/discharging the detection capacitor 33 is for example carried out by controlling the input/output ports 21 and 22 as indicated in the following table:

|  | Charging the detection capacitor 33 | Discharging the detection capacitor 33 | Measuring the first voltage signal |
|---|---|---|---|
| Input/output port 21 | VCC | IN | IN |
| Input/output port 22 | VCC | GND | GND |

In the table above:

VCC corresponds to an electrical supply potential,

GND corresponds to the electrical potential of the electrical ground,

IN means that the input/output port in question is used as input, to measure the first voltage signal.

The second voltage signal is measured during a phase consisting in producing a capacitive divider bridge between the reference capacitor 31 and the detection capacitor 33, during which the reference capacitor 31 and the detection capacitor 33, connected electrically in series, are charged by the microcontroller 20. Once charge balancing has been achieved between the reference capacitor 31 and the detection capacitor 33, the second voltage signal is for example measured as being the voltage across the terminals of the detection capacitor 33.

Such a phase of producing a capacitive divider bridge is for example carried out by controlling the input/output ports 21 and 22 as indicated in the following table:

|  | Charging the reference capacitor 31 and the detection capacitor 33 | Measuring the second voltage signal |
|---|---|---|
| Input/output port 21 | IN | IN |
| Input/output port 22 | VCC | VCC |

By denoting the first voltage signal by M1 and the second voltage signal by M2, the measurement signal N is for example calculated by the microcontroller 20 as being the difference between the first voltage signal and the second voltage signal, N=M1−M2, hence the qualification of "differential" for such a detection device 10.

The respective values of the reference capacitor 31 and of the detection capacitor 33 in the absence of the presence of a hand are for example chosen to be equal.

In such a case, in the absence of the presence of a hand, the first voltage signal and the second voltage signal are in principle both equal to VCC/2, such that the measurement signal N is zero.

Conversely, in the presence of a hand in the detection area, the apparent value of the detection capacitor 33 increases, which causes the first voltage signal M1 to increase with respect to VCC/2 and the second voltage signal M2 to decrease with respect to VCC/2. Consequently, the measurement signal N also increases, and the presence of a hand may for example be detected when the measurement signal N becomes higher than a predetermined positive threshold value.

However, such a detection device 10 (CVD or DCVD) has certain limitations.

In particular, there are external elements, other than the presence of a hand, which are capable of affecting the apparent value of the detection capacitor 33. For example, the presence of water (rain, moisture) in the detection area may modify the apparent value of the detection capacitor 33 and lead to a false detection of the presence of a hand.

In addition, it may be desired to be able to detect the presence of a hand in a plurality of different detection areas. Increasing the number of electronic components needed to allow such multi-area detection may however prove to be too complex and costly for applications like the door handle of a motor vehicle.

SUMMARY OF THE INVENTION

An aspect of the present invention aims to overcome all or some of the limitations of the solutions of the prior art, in particular those set out above, by proposing a solution which makes it possible to be more robust with respect to external elements and which further makes it possible to limit the complexity required to perform multi-area detection.

To this end, and according to a first aspect, the invention relates to a device for detecting the presence of a user of a motor vehicle, including a sensor connected to a microcontroller, said sensor including a first electrode, forming a first detection capacitor, arranged in a first detection area. Said sensor further includes a second electrode, forming a second detection capacitor, arranged in a second detection area, and said microcontroller is configured to recurrently repeat a measurement phase including:
  a phase of charging/discharging the first detection capacitor during which the microcontroller charges the first detection capacitor, discharges said first detection capacitor into the second detection capacitor until a first balance level is reached, and measures a first voltage signal representative of said first balance level,
  a phase of charging/discharging the second detection capacitor during which the microcontroller charges the second detection capacitor, discharges said second detection capacitor into the first detection capacitor until a second balance level is reached, and measures a second voltage signal representative of said second balance level,
  calculating a measurement signal by comparing the first voltage signal with the second voltage signal.

The microcontroller is further configured to detect a presence of a user in the first detection area and/or the second detection area when the measurement signal meets a predetermined detection criterion.

Thus, the detection device is multi-area in that it includes at least two detection capacitors, namely the first detection capacitor and the second detection capacitor, the electrodes of which are arranged in different respective detection areas, namely the first detection area and the second detection area.

The detection device may also be without a capacitor used only as a reference capacitor. Specifically:
  the first detection capacitor is used for detection in the first detection area and as a reference capacitor for the second detection capacitor, and
  the second detection capacitor is used for detection in the second detection area and as a reference capacitor for the first detection capacitor.

Consequently, the number of electronic components needed for achieving multi-area detection is substantially decreased compared to what would have been required according to the prior art. Specifically, according to the prior art, at least two capacitors per detection area (a detection capacitor and a reference capacitor) would have been required, whereas it is possible according to an aspect of the invention to provide only one capacitor per detection area (the detection capacitor, since the reference capacitor is embodied by a detection capacitor for another detection area).

The complexity of the detection device is also greatly decreased because it is the same measurement signal which is used to detect a presence of a user in the first detection area and/or in the second detection area.

Furthermore, since the reference capacitor is also a detection capacitor including an electrode in a detection area, it will also be subject to external elements. Such a detection device is therefore more robust with respect to external elements which affect the different detection areas substantially in the same way (such as, for example, the presence of moisture), since the apparent values of all of the detection capacitors will be affected in the same way.

In particular embodiments, the detection device may further include one or more of the following features, taken alone or in any technically possible combination.

In particular embodiments, the first electrode and the second electrode are connected by a resistive component.

Such arrangements make it possible to provide for discharging from the first detection capacitor into the second detection capacitor (and vice versa) in a particularly straightforward and economical manner.

In particular embodiments, the first electrode is connected to a first port of the microcontroller by a resistive component and/or the second electrode is connected to a second port of the microcontroller by a resistive component.

In particular embodiments, the first detection capacitor is arranged in parallel with a first control capacitor and/or the second detection capacitor is arranged in parallel with a second control capacitor.

According to a second aspect, the invention relates to a motor vehicle including a detection device according to any one of the embodiments of the invention.

In particular embodiments, the sensor of the detection device is mounted at least partly in a door handle of said motor vehicle.

According to a third aspect, the invention relates to a method for detecting the presence of a user of a motor vehicle, said motor vehicle including a sensor including a first electrode, forming a first detection capacitor, arranged in a first detection area. Said sensor further including a second electrode, forming a second detection capacitor, arranged in a second detection area, said method includes a phase of measuring a measurement signal and a phase of evaluating the measurement signal which are recurrently repeated, each measurement phase including:
  a phase of charging/discharging the first detection capacitor including charging the first detection capacitor, discharging said first detection capacitor into the second detection capacitor until a first balance level is reached, and measuring a first voltage signal representative of said first balance level, a phase of charging/discharging the second detection capacitor including charging the second detection capacitor, discharging said second detection capacitor into the first detection capacitor until a second balance level is reached, and measuring a second voltage signal representative of said second balance level, calculating the measurement signal by comparing the first voltage signal with the second voltage signal.

Additionally, a presence of a user in the first detection area and/or the second detection area is detected during the evaluation phase when the measurement signal meets a predetermined detection criterion.

In particular implementations, the detection method may further include one or more of the following features, taken alone or in any technically possible combination.

In particular implementations, a presence of a user is detected in the first detection area when the measurement signal is higher than a first predetermined threshold value that is higher than a theoretical value of said measurement signal in the absence of the presence of a user.

In particular implementations, a presence of a user is detected in the second detection area when the measurement signal is lower than a second predetermined threshold value that is lower than a theoretical value of said measurement signal in the absence of the presence of a user.

In particular implementations, a movement of a presence of a user from the first detection area to the second detection area is detected when the temporal evolution of the measurement signal corresponds to a first predetermined detection pattern and/or a movement of a presence of a user from the second detection area to the first detection area is detected when the temporal evolution of the measurement signal corresponds to a second predetermined detection pattern.

BRIEF DESCRIPTION OF THE DRAWINGS

Aspects of the invention will be better understood upon reading the following description, provided by way of entirely non-limiting example and with reference to the figures, which represent.

DETAILED DESCRIPTION OF THE PREFERRED EMBODIMENTS

In these figures, references that are identical from one figure to the next denote identical or analogous elements. For the sake of clarity, the elements shown are not to scale, unless indicated otherwise.

An aspect of the present invention relates in particular to a presence detection device 40 for mounting in a motor vehicle (not shown in the figures).

Throughout the rest of the description, reference is made without limitation to the case in which the detection device 40 aims to detect the presence of a user in a detection area linked to a motor vehicle door handle (not shown in the figures), for example to allow said door to be locked and/or unlocked.

It should be noted, however, that the detection device 40 according to an aspect of the invention may also be used, in other implementations, to detect the presence of a user in other locations on a motor vehicle, for example at the trunk of said motor vehicle.

Figure 1:
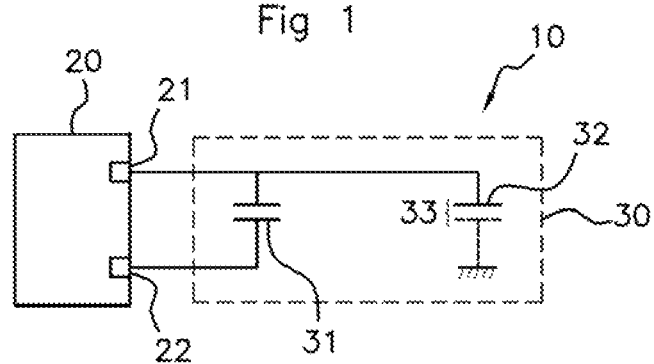
FIG. 1: already described, a schematic representation of a detection device according to the prior art.
Figure 2:
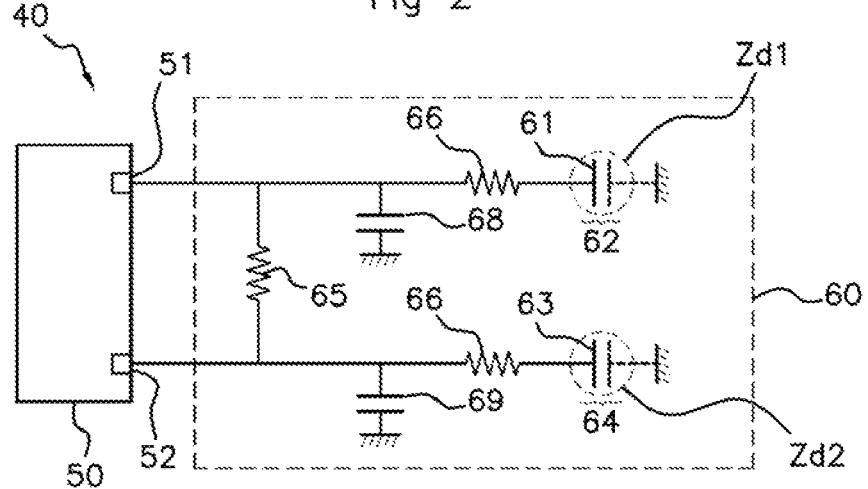
FIG. 2: a schematic representation of one exemplary embodiment of a detection device according to an aspect of the invention.

FIG. 2 schematically shows one non-limiting exemplary embodiment of a device 40 for detecting the presence of a user.

As illustrated in FIG. 2, the detection device 40 includes a sensor 60 connected to a microcontroller 50.

The sensor 60, which is to be mounted at least partly in the handle of the door of the motor vehicle, includes:
 a first electrode 61, forming a first detection capacitor 62, arranged in a first detection area Zd1,
 a second electrode 63, forming a second detection capacitor 64, arranged in a second detection area Zd2.

The sensor 60 therefore makes it possible to detect the presence of a user's hand in different detection areas of the door handle, namely the first detection area Zd1 and the second detection area Zd2.

The first detection area Zd1 and the second detection area Zd2 may be adjacent to one another, for example arranged in proximity to one another on the same face of the handle, for example the outer face (on the opposite side with respect to the door) of said handle. In such a case, the hand of a user, or at least one finger thereof, may easily slide from the first detection area Zd1 to the second detection area Zd2 (and vice versa).

Alternatively, the first detection area Zd1 and the second detection area Zd2 may be non-adjacent. For example, the first detection area Zd1 is arranged on the outside face of said handle, while the second detection area Zd2 is arranged on an inside face (on the door side) of said handle. In such a case, the detection of a hand in the first detection area Zd1 is for example used to lock the door, while the detection of a hand in the second detection area Zd2 is for example used to unlock said door.

The microcontroller 50 includes for example one or more processors and storage means (magnetic hard disk, electronic memory, optical disk, etc.) on which a computer program product is stored, in the form of a set of program code instructions to be executed in order to implement the steps of a presence detection method 70 described below. Alternatively or in addition, the microcontroller 50 includes one or more programmable logic circuits (FPGA, PLD, etc.), and/or one or more specialized integrated circuits (ASIC, etc.), and/or a set of discrete electronic components, etc., suitable for implementing all or some of said steps of the detection method 70.

In other words, the microcontroller 50 includes a set of means configured as software (specific computer program product) and/or hardware (FPGA, PLD, ASIC, discrete electronic components, etc.) for implementing, in collaboration with the sensor 60, the steps of the presence detection method 70 described below.

For example, said microcontroller 50 is configured to recurrently repeat a measurement phase including:

a phase of charging/discharging the first detection capacitor 62 during which the microcontroller 50 charges the first detection capacitor 62, discharges said first detection capacitor 62 into the second detection capacitor 64 until a first balance level is reached, and measures a first voltage signal representative of said first balance level, a phase of charging/discharging the second detection capacitor 64 during which the microcontroller 50 charges the second detection capacitor 64, discharges said second detection capacitor 64 into the first detection capacitor 62 until a second balance level is reached, and measures a second voltage signal representative of said second balance level.

FIG. 2 shows one preferred embodiment of the detection device 40 in which said detection device 40 includes, in order to allow the first detection capacitor 62 to discharge into the second detection capacitor 64 (and vice versa), a resistive component 65 connecting the first electrode 61 and the second electrode 63.

More particularly, in the non-limiting example illustrated by FIG. 2, the first electrode 61 is connected to a first port 51 of the microcontroller 50, and the second electrode 63 is connected to a second port 52 of the microcontroller 50. The resistive component 65 is arranged between said first port 51 and said second port 52 of the microcontroller 50.

The first port 51 and the second port 52 are preferably input/output ports of said microcontroller 50, i.e. ports allowing an electrical potential to be applied to the electronic components connected to these ports (use as output ports), and allowing an electrical potential received from the electronic components connected to these ports to be acquired (use as input ports). There is nothing to rule out, however, according to other examples, other types of ports from being considered. In particular, the first port 51 and the second port 52 may be only input ports. An electrical potential may then be applied for example by means of switches external to the microcontroller 50, but controlled by same.

The use of such a resistive component 65 is particularly straightforward and economical. There is nothing to rule out, however, according to other examples, other means configured to allow the first detection capacitor 62 to be discharged into the second detection capacitor 64 and the second detection capacitor 64 to be discharged into the first detection capacitor 62 from being envisaged. For example, these means may be in the form of a switch arranged between the first port 51 and the second port 52. Such a switch is then in the open state to charge one from said first detection capacitor 62 and second detection capacitor 64 without charging the other, and in the closed state to discharge one from said first detection capacitor and second detection capacitor into the other.

In particular embodiments, and as illustrated by FIG. 2, the first electrode 61 is connected to the first port 51 of the microcontroller 50 by a resistive component 66 and/or the second electrode 63 is connected to the second port 52 by a resistive component 67.

In particular embodiments, and as illustrated by FIG. 2, the first detection capacitor 62 is arranged in parallel with a first control capacitor 68 and/or the second detection capacitor 64 is arranged in parallel with a second control capacitor 69.

The first control capacitor 68 is used for example to adjust the overall value of a first capacitive assembly, formed by the first detection capacitor 62 and the first control capacitor 68, to a first predetermined capacitance value in the absence of presence of a hand in the first detection area Zd1.

Similarly, the second control capacitor 69 is used for example to adjust the overall value of a second capacitive assembly, formed by the second detection capacitor 64 and the second control capacitor 69, to a second predetermined capacitance value in the absence of presence of a hand in the second detection area Zd2.

In the following description, reference is made without limitation to the case in which the first capacitance value and the second capacitance value are equal. It should be noted that such equality may also be obtained without a control capacitor (if the values of the first detection capacitor 62 and of the second detection capacitor 64 are equal in the absence of presence of a hand), or by means of a single control capacitor. Additionally, there is nothing to rule out, according to other examples, having the first capacitance value different from the second capacitance value.

In the example illustrated by FIG. 2, the first control capacitor 68 forms, together with the resistive component 66, a low-pass filter suitable for filtering high-frequency interference. For example, the first control capacitor 68 has a value of 10 picofarads (pF) and the resistive component 66 has a value of 330 kilo-ohms (kΩ) to have a cut-off frequency for the low-pass filter of approximately 50 kilohertz (kHz).

Similarly, in the example illustrated by FIG. 2, the second control capacitor 69 forms, together with the resistive component 67, a low-pass filter suitable for filtering high-frequency interference. For example, the second control capacitor 69 has a value of 10 pF and the resistive component 67 has a value of 330 kΩ to have a cut-off frequency of about 50 kHz.

Figure 3:
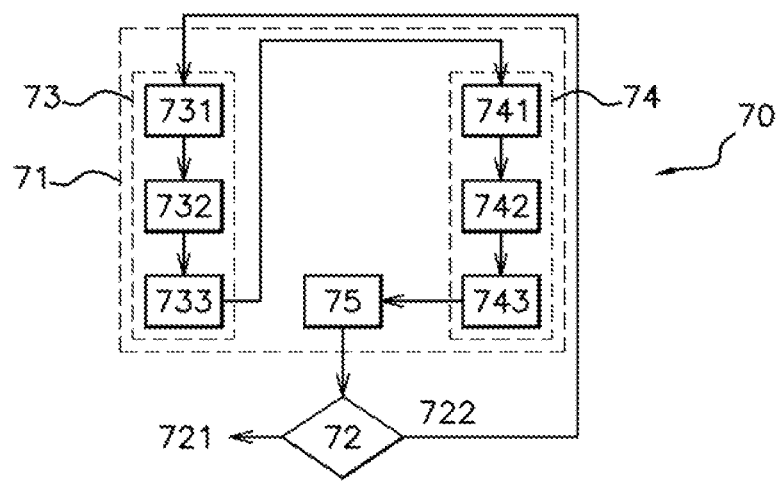
FIG. 3: a diagram illustrating the main steps of a detection method.

FIG. 3 shows the main steps of a method 70 for detecting the presence of a user near a motor vehicle.

As illustrated by FIG. 3, the detection method 70 includes a phase 71 of measuring a measurement signal N, and a phase 72 of evaluating a detection criterion according to the measurement signal N.

The measurement phase 71 and the evaluation phase 72 are repeated recurrently, for example periodically. It should be noted that the measurement phase 71 is preferably always followed by an evaluation phase 72. However, the measurement phase 71 and the evaluation phase 72 may also, according to other exemplary implementations, be repeated differently from one another, for example with different respective periods in the case of a periodic repetition. For example, it is possible to wait, before carrying out the evaluation phase 72, for the measurement phase 71 to have been carried out a predetermined number Nb of times in order to have Nb successive values of the measurement signal N available for evaluating the detection criterion.

As illustrated by FIG. 3, the measurement phase 71 includes two different phases:

a phase 73 of charging/discharging the first detection capacitor 62 which allows a first voltage signal to be measured, a phase 74 of charging/discharging the second detection capacitor 64 which allows a second voltage signal to be measured.

The order in which the phase 73 of charging/discharging the first detection capacitor 62 and the phase 74 of charging/discharging the second detection capacitor 64 is carried out is unimportant. In the example illustrated by FIG. 3, the phase 73 of charging/discharging the first detection capacitor 62 is carried out before the phase 74 of charging/discharging the second detection capacitor 64. It is however also possible, according to other examples, to carry out the phase 74 of charging/discharging the second detection capacitor 64 first and then to carry out the phase 73 of charging/discharging the first detection capacitor 62.

After having measured the first voltage signal and the second voltage signal, the measurement phase 71 includes a step 75 of calculating the measurement signal N by comparing said first voltage signal and said second voltage signal.

As illustrated by FIG. 3, the phase 73 of charging/discharging the first detection capacitor 62 includes the following steps:
  a step 731 of charging the first detection capacitor 62,
  a step 732 of discharging said first detection capacitor 62 into the second detection capacitor 64 until a first balance level is reached,
  a step 733 of measuring the first voltage signal representative of said first balance level.

In practice, the charging 731, discharging 732 and measurement 733 steps are preferably carried out in succession. More particularly, the discharging step 732 is carried out after the first detection capacitor 62 has reached a maximum charge level, taking into account the charging voltage applied. The measurement step 733 is carried out once discharging has ended, i.e. when there is no longer any transfer of charge from the first detection capacitor 62 into the second detection capacitor 64, said first detection capacitor 62 (and the second detection capacitor 64) having reached a first balance level in which the charges of the first electrode 61 and those of the second electrode 63 are balanced.

In a known manner, the first detection capacitor 62 is charged and discharged within the sensor 60 according to a time constant T which may be predetermined, and it therefore suffices to wait for a duration longer than the time constant T, for example five times longer than this, to reach the maximum charge level (and therefore to be able to carry out discharging step 732), and then to reach the first balance level (and therefore to be able to carry out measurement step 733).

The second detection capacitor 64 is preferably fully discharged (i.e. the voltage across its terminals is zero) before carrying out step 732 of discharging the first detection capacitor 62 into said second detection capacitor 64. The first detection capacitor 62 may also be fully discharged before carrying out charging step 731. In particular implementations, the phase 73 of charging/discharging the first detection capacitor 62 may therefore include to this end a step of completely discharging the first detection capacitor 62 and the second detection capacitor 64 (not shown in the figures), carried out before executing charging step 731.

The first voltage signal measured during the measurement step 733 is representative of the discharging of the first detection capacitor 62 as the outcome of the discharging step 732 into the second detection capacitor 64, i.e. representative of the first balance level in which there is no longer any transfer of charge from the first detection capacitor 62 into the second detection capacitor 64, the charges of the first electrode 61 and those of the second electrode 63 being balanced.

For example, the first measured voltage signal corresponds to the electrical potential of the first electrode 61 or to the electrical potential of the second electrode 63 (these electrical potentials being equal for the detection device 40 of FIG. 2).

As illustrated by FIG. 3, the phase 74 of charging/discharging the second detection capacitor 64 includes the following steps:
  a step 741 of charging the second detection capacitor 64,
  a step 742 of discharging said second detection capacitor 64 into the first detection capacitor 62 until a second balance level is reached,
  a step 743 of measuring the second voltage signal representative of said second balance level.

Everything that has been described above with reference to the phase 73 of charging/discharging the first detection capacitor 62 is also applicable to the phase 74 of charging/discharging the second detection capacitor 64.

The second voltage signal measured during the measurement step 743 is representative of the discharging of the second detection capacitor 64 as the outcome of the discharging step 742 into the first detection capacitor 62, i.e. representative of a second balance level in which there is no longer any transfer of charge from the second detection capacitor 64 into the first detection capacitor 62, the charges of the first electrode 61 and those of the second electrode 63 being balanced.

For example, the second measured voltage signal corresponds to the electrical potential of the second electrode 63 or to the electrical potential of the first electrode 61 (these electrical potentials being equal for the detection device 40 of FIG. 2).

The phase 73 of charging/discharging the first detection capacitor 62 is for example carried out, in the case of the detection device 40 of FIG. 2, by controlling the first port 51 and the second port 52 as indicated in the following table:

|  | Charging the first detection capacitor 62 | Discharging the first detection capacitor 62 | Measuring the first voltage signal |
|---|---|---|---|
| First port 51 | VCC | IN | IN |
| Second port 52 | GND | IN | IN |

In the table above:
VCC corresponds to an electrical supply potential,
GND corresponds to the electrical potential of the electrical ground,
IN means that the port is used as an input, i.e. its electrical potential is not controlled by the microcontroller 50 and it may be used to carry out a measurement.

To completely discharge, if necessary, the first detection capacitor 62 and the second detection capacitor 64, it is possible to apply the electrical potential GND simultaneously to the first port 51 and to the second port 52 before carrying out charging step 731.

The phase 74 of charging/discharging the second detection capacitor 64 is for example carried out, in the case of the detection device 40 of FIG. 2, by controlling the first port 51 and the second port 52 as indicated in the following table:

|  | Charging the second detection capacitor 64 | Discharging the second detection capacitor 64 | Measuring the second voltage signal |
|---|---|---|---|
| First port 51 | GND | IN | IN |
| Second port 52 | VCC | IN | IN |

To completely discharge, if necessary, the first detection capacitor 62 and the second detection capacitor 64, it is possible to apply the electrical potential GND simultaneously to the first port 51 and to the second port 52 before carrying out charging step 741.

By denoting the first voltage signal by M1 and the second voltage signal by M2, the measurement signal N is for example calculated by the microcontroller 20 as being the difference between the first voltage signal and the second voltage signal, N=M1−M2. However, there is nothing to rule out calculating the measurement signal N according to other expressions allowing the first voltage signal M1 and the second voltage signal M2 to be compared.

In the case of the detection device 40 of FIG. 2, the first voltage signal and the second voltage signal may be measured by means of either the first port 51 or the second port 52.

During the evaluation phase 72, a detection criterion is evaluated according to the measurement signal N. If the detection criterion is met (reference 721 in FIG. 3), then it is considered that a hand is present in the first detection area Zd1 or the second detection area Zd2. Otherwise, (reference 722 in FIG. 3), it is considered that there is no hand present in the first detection area Zd1 and that there is no hand present in the second detection area Zd2.

In general, different detection criteria may be considered, and the choice of one or more particular detection criteria constitutes only a variant implementation of an aspect of the invention.

FIG. 4 schematically shows the temporal evolution of the measurement signal N according to the presence or absence of a hand in proximity to the sensor 60 of the detection device 40.

Given that the first capacitance value and the second capacitance value are equal, then, in the absence of the presence of a hand, the first voltage signal and the second voltage signal are in principle both equal to VCC/2. Consequently, the theoretical value of the measurement signal N in the absence of the presence of a hand is zero.

Figure 4A:
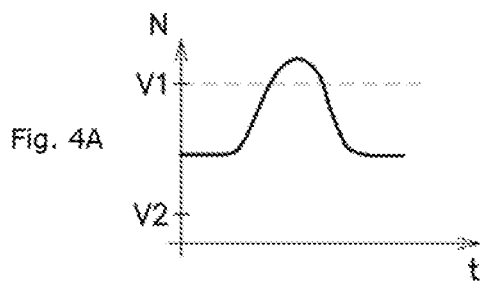
FIGS. 4A and 4B: timing diagrams illustrating the temporal evolution of a measurement signal N used for detection.

FIG. 4A shows the evolution of the measurement signal N as a hand approaches the first detection area Zd1. As a hand approaches the first detection area Zd1, the apparent value of the first detection capacitor 62 increases, which causes the first voltage signal M1 to increase relative to VCC/2 and the second voltage signal M2 to decrease relative to VCC/2. Consequently, the measurement signal N increases relative to the zero value.

For example, the evaluation of the detection criterion includes comparing the measurement signal N with a first, positive predetermined threshold value V1, and the detection criterion is considered to be met when the measurement signal N becomes higher than said first threshold value V1, meaning that the detected hand is located in the first detection area Zd1.

Figure 4B:
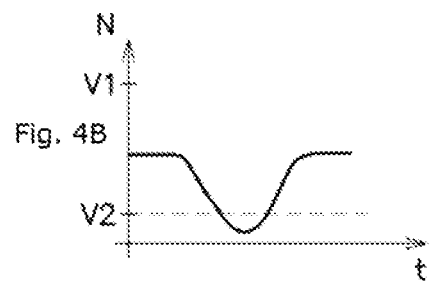

FIG. 4B shows the evolution of the measurement signal N as a hand approaches the second detection area Zd2. As a hand approaches the second detection area Zd2, the apparent value of the second detection capacitor 64 increases, which causes the first voltage signal M1 to decrease relative to VCC/2 and the second voltage signal M2 to increase relative to VCC/2. Consequently, the measurement signal N decreases relative to the zero value.

For example, the evaluation of the detection criterion includes comparing the measurement signal N with a second, negative predetermined threshold value V2, and the detection criterion is considered to be met when the measurement signal N becomes lower than said second threshold value V2, meaning that the detected hand is located in the second detection area Zd2.

Thus, the measurement signal N makes it possible to distinguish between a detection in the first detection area Zd1 (positive measurement signal N in the example described) and a detection in the second detection area Zd2 (negative measurement signal N in the example described).

In the event of the presence of external elements substantially affecting the first detection area Zd1 and the second detection area Zd2 in the same way (such as, for example, the presence of moisture), then the apparent value of the first detection capacitor 62 and the apparent value of the second detection capacitor 64 will increase substantially in the same way. Consequently, the measurement signal N will remain substantially zero despite the presence of these external elements, thereby avoiding confusing the presence of external elements with the presence of a hand.

In the case of the first detection area Zd1 and the second detection area Zd2 being adjacent, then the hand of a user, or at least a finger thereof, may easily slide from the first detection area Zd1 to the second detection area Zd2 (and vice versa). In this case, the evaluation of the detection criterion may be used not only to detect the presence of a hand in the first detection area Zd1 or in the second detection area Zd2, but also to detect a particular movement of the finger relative to the sensor 60, for example a movement from the first detection area Zd1 to the second detection area Zd2.

The advantage of detecting a movement relative to the sensor 60 lies in particular in the fact that this makes it possible to improve the robustness of the detection device 40 in the event of the presence of external elements (rain, etc.) which do not affect the first detection area Zd1 and the second detection area Zd2 in the same way. Specifically, the temporal evolution of the measurement signal N in the case of movement of a finger from the first detection area Zd1 to the second detection area Zd2 (or vice versa) then forms a characteristic pattern which cannot generally be reproduced by the presence of external elements in the first detection area Zd1 and/or in the second detection area Zd2.

Figures 5A, 5B, 5C:
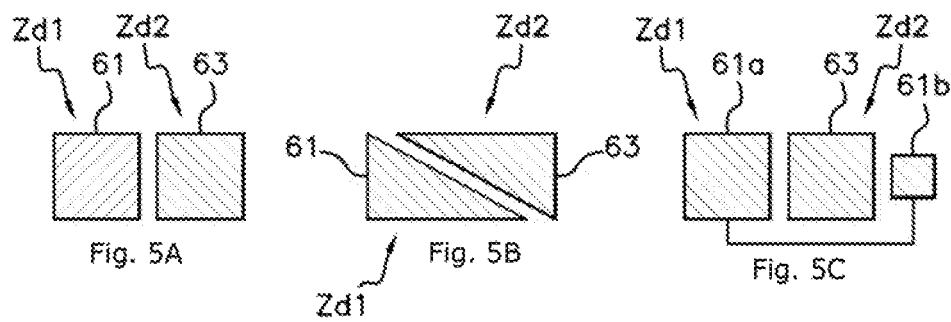
FIGS. 5A-5C: schematic representations of exemplary electrode arrangements of the detection device.

FIGS. 5A-5C schematically show examples of possible arrangements of the first electrode 61 and the second electrode 63, in the case of the first detection area Zd1 and the second detection area Zd2 being adjacent.

FIG. 5A, the first electrode 61 and the second electrode 63 are both substantially rectangular in shape and are arranged side by side in the continuation of one another.

FIG. 5B, the first electrode 61 and the second electrode 63 are both substantially in the shape of right-angled triangles and are arranged side by side with their hypotenuses facing one another, so as to form together a substantially rectangular shape.

FIG. 5C, the first electrode is formed by two remote parts 61*a* and 61*b*, which are electrically connected so that they are at the same electrical potential. Part 61*a* and part 61*b* of the first electrode and the second electrode 63 are all substantially rectangular in shape, and are arranged side by side in the continuation of one another, the second electrode 63 being interposed between part 61*a* and part 61*b* of the first electrode. In this exemplary embodiment, part 61*b* of the first electrode forms a third detection area of the detection device 40. The dimensions of part 61*b* are smaller than those of part 61*a*, such that the presence of a finger in the third detection area is for example detected when the measurement signal N exceeds a third, positive predetermined threshold value V3, lower than the first threshold value V1, without exceeding said first threshold value V1.

Figure 6A:
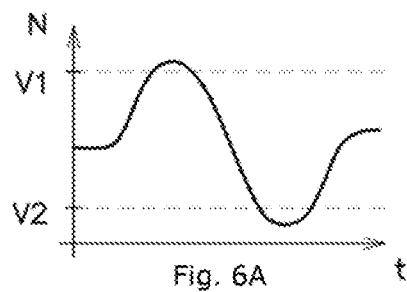
FIGS. 6A-6B and FIGS. 7A-7B: timing diagrams illustrating the temporal evolution of the measurement signal N in the event of movement of a hand relative to the detection device.
Figure 6B:
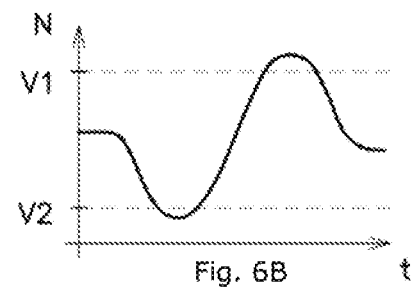

FIGS. 6A-6B schematically show the temporal evolution of the measurement signal N in the case of an arrangement as illustrated by FIGS. 5A-5B.

FIG. 6A shows the case of a movement from the first detection area Zd1 to the second detection area Zd2. The measurement signal N begins by gradually increasing until it exceeds the first threshold value V1 when the finger is located in the first detection area Zd1. Next, the measurement signal N gradually decreases until it passes below the second threshold value V2 when the finger is located in the second detection area Zd2. Such a temporal evolution of the measurement signal N is characteristic of a movement of the finger from the first detection area Zd1 to the second detection area Zd2, which may be detected by comparing this temporal evolution with a first predetermined detection pattern. The temporal evolution of the measurement signal N is for example considered to correspond to the first detection pattern when the measurement signal N successively crosses the first threshold value V1 and the second threshold value V2 and if the time difference between these successive crossings is not greater than a predetermined maximum duration.

FIG. 6B shows the case of a movement from the second detection area Zd2 to the first detection area Zd1. The measurement signal N begins by gradually decreasing until it passes below the second threshold value V2 when the finger is located in the second detection area Zd2. Next, the measurement signal N gradually increases until it exceeds the first threshold value V1 when the finger is located in the first detection area Zd1. Such a temporal evolution of the measurement signal N is characteristic of a movement of the finger from the second detection area Zd2 to the first detection area Zd1, which may be detected by comparing this temporal evolution with a second predetermined detection pattern. The temporal evolution of the measurement signal N is for example considered to correspond to the second detection pattern when the measurement signal N successively crosses the second threshold value V2 and the first threshold value V1 and if the time difference between these successive crossings is not greater than a predetermined maximum duration.

Figure 7A:
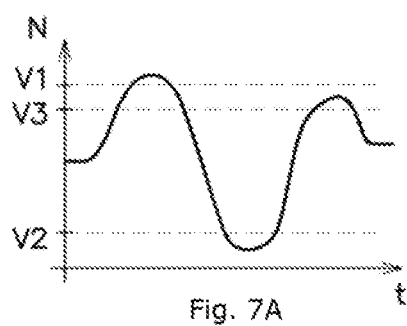
Figure 7B:
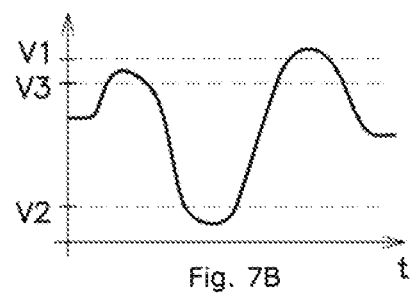

FIGS. 7A-7B schematically show the temporal evolution of the measurement signal N in the case of an arrangement as illustrated by part c) of FIG. 5, including three detection areas.

FIG. 7A shows the case of a movement from the first detection area Zd1 to the third detection area, passing through the second detection area Zd2. The measurement signal N begins by gradually increasing until it exceeds the first threshold value V1 when the finger is in the first detection area Zd1. Next, the measurement signal N gradually decreases until it passes below the second threshold value V2 when the finger is in the second detection area Zd2. Finally, the measurement signal N gradually increases again until it exceeds the third threshold value V3 without exceeding the first threshold value V1 when the finger is in the third detection area. Such a movement may therefore be considered as having been detected when the measurement signal N successively crosses the first threshold value V1, the second threshold value V2 and the third threshold value V3 and if the time difference between the first and the last of these successive crossings is not greater than a predetermined maximum duration.

FIG. 7B shows the case of a movement from the third detection area to the first detection area Zd1, passing through the second detection area Zd2. The measurement signal N begins by gradually increasing until it exceeds the third threshold value V3 without exceeding the first threshold value V1 when the finger is in the third detection area. Next, the measurement signal N gradually decreases until it passes below the second threshold value V2 when the finger is in the second detection area Zd2. Lastly, the measurement signal N gradually increases again until it exceeds the first threshold value V1 when the finger is in the first detection area Zd1. Such a movement may therefore be considered as having been detected when the measurement signal N successively crosses the third threshold value V3, the second threshold value V2 and the first threshold value V1 and if the time difference between the first and the last of these successive crossings is not greater than a predetermined maximum duration.

The invention claimed is:

1. A device for detecting the presence of a user of a motor vehicle, comprising:
   a microcontroller;
   a sensor connected to the microcontroller, said sensor including:
      a first electrode, forming a first detection capacitor, arranged in a first detection area of the sensor such that a first capacitance of the first detection capacitor varies when a user is in front of the first detection area in proximity to the first detection capacitor, and
      a second electrode, forming a second detection capacitor, arranged in a second detection area of the sensor such that a second capacitance of the second detection capacitor varies when the user is in front of the second detection area in proximity to the second detection capacitor, and
   said microcontroller is configured to recurrently repeat a measurement phase including:
      a step of completely discharging the first detection capacitor and the second detection capacitor,
      a phase of charging/discharging the first detection capacitor during which the microcontroller charges the first detection capacitor, discharges said first detection capacitor into the second detection capacitor until a first balance level is reached, and measures a first voltage signal representative of said first balance level,
      a step of completely discharging the first detection capacitor and the second detection capacitor,
      a phase of charging/discharging the second detection capacitor during which the microcontroller charges the second detection capacitor, discharges said second detection capacitor into the first detection capacitor until a second balance level is reached, and measures a second voltage signal representative of said second balance level,
      calculating a measurement signal by comparing the first voltage signal with the second voltage signal,
      wherein when the user is in front of the first detection area in proximity to the first detection capacitor, the first capacitance of the first detection capacitor increases causing the first voltage signal to increase and the second voltage signal to decrease, and
      wherein when the user is in front of the second detection area in proximity to the second detection capacitor, the second capacitance of the second detection capacitor increases causing the second voltage signal to increase and the first voltage signal to decrease,
   said microcontroller being further configured to detect a presence of the user in the first detection area and/or the second detection area when the measurement signal meets a predetermined detection criterion.

2. The detection device as claimed in claim 1, wherein the first electrode and the second electrode are connected by a first resistive component.

3. The detection device as claimed in claim 1, wherein the first electrode is connected to a first port of the microcontroller by a second resistive component and/or the second electrode is connected to a second port of the microcontroller by a third resistive component.

4. The detection device as claimed in claim 1, wherein the first detection capacitor is arranged in parallel with a first control capacitor and/or the second detection capacitor is arranged in parallel with a second control capacitor.

5. A motor vehicle comprising a detection device as claimed in claim 1.

6. The motor vehicle as claimed in claim 5, wherein the sensor of the detection device is mounted at least partly in a door handle of said motor vehicle.

7. The detection device as claimed in claim 2, wherein the first electrode is connected to a first port of the microcontroller by a second resistive component and/or the second electrode is connected to a second port of the microcontroller by a third resistive component.

8. A method for detecting the presence of a user of a motor vehicle, said motor vehicle including a sensor including a first electrode, forming a first detection capacitor, arranged in a first detection area of the sensor such that a first capacitance of the first detection capacitor varies when a user is in front of the first detection area in proximity to the first detection capacitor, a second electrode, forming a second detection capacitor, arranged in a second detection area of the sensor such that a second capacitance of the second detection capacitor varies when the user is in front of the second detection area in proximity to the second detection capacitor, said method includes a phase of measuring a measurement signal and a phase of evaluating the measurement signal which are recurrently repeated, each measurement phase including:
   a step of completely discharging the first detection capacitor and the second detection capacitor,
   a phase of charging/discharging the first detection capacitor including charging the first detection capacitor, discharging said first detection capacitor into the second detection capacitor until a first balance level is reached, and measuring a first voltage signal representative of said first balance level,
   a step of completely discharging the first detection capacitor and the second detection capacitor,
   a phase of charging/discharging the second detection capacitor including charging said second detection capacitor, discharging said second detection capacitor into the first detection capacitor until a second balance level is reached, and measuring a second voltage signal representative of said second balance level,
   calculating the measurement signal by comparing the first voltage signal with the second voltage signal,
   wherein when the user is in front of the first detection area in proximity to the first detection capacitor, the first capacitance of the first detection capacitor increases causing the first voltage signal to increase and the second voltage signal to decrease,
   wherein when the user is in front of the second detection area in proximity to the second detection capacitor, the second capacitance of the second detection capacitor increases causing the second voltage signal to increase and the first voltage signal to decrease, and
   wherein the presence of the user in the first detection area and/or the second detection area is detected during the evaluation phase when the measurement signal meets a predetermined detection criterion.

9. The detection method as claimed in claim 8, wherein a presence of a user is detected in the first detection area when the measurement signal is higher than a first predetermined threshold value that is higher than a theoretical value of said measurement signal in the absence of the presence of a user.

10. The detection method as claimed in claim 8, wherein a presence of a user is detected in the second detection area when the measurement signal is lower than a second predetermined threshold value that is lower than a theoretical value of said measurement signal in the absence of the presence of a user.

11. The detection method as claimed in claim 8, wherein a movement of a presence of a user from the first detection area to the second detection area is detected when the temporal evolution of the measurement signal corresponds to a first predetermined detection pattern and/or a movement of a presence of a user from the second detection area to the first detection area is detected when the temporal evolution of the measurement signal corresponds to a second predetermined detection pattern.

12. The detection method as claimed in claim 9, wherein a presence of a user is detected in the second detection area when the measurement signal is lower than a second predetermined threshold value that is lower than a theoretical value of said measurement signal in the absence of the presence of a user.

* * * * *